United States Patent
Grabinski et al.

(10) Patent No.: US 10,969,810 B2
(45) Date of Patent: Apr. 6, 2021

(54) VOLTAGE REGULATOR WITH VIRTUAL ZERO QUIESCENT CURRENT

(71) Applicant: Dialog Semiconductor (UK) Limited, London (GB)

(72) Inventors: Jan Grabinski, Owen (DE); Frank Kronmueller, Neudenau (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/372,759

(22) Filed: Apr. 2, 2019

(65) Prior Publication Data

US 2020/0117225 A1   Apr. 16, 2020

(30) Foreign Application Priority Data

Oct. 11, 2018 (DE) .......................... 102018217442.3

(51) Int. Cl.
G05F 1/575 (2006.01)
H03F 3/45 (2006.01)

(52) U.S. Cl.
CPC .......... G05F 1/575 (2013.01); H03F 3/45269 (2013.01); H03F 3/45273 (2013.01)

(58) Field of Classification Search
CPC ........ G05F 1/57; G05F 1/575; H03F 3/45273; H03F 3/45259; H03F 3/345; H03F 3/45183

See application file for complete search history.

(56) References Cited

U.S. PATENT DOCUMENTS

| | | | |
|---|---|---|---|
| 3,617,859 A | 11/1971 | Dobkin et al. | |
| 2008/0061750 A1* | 3/2008 | Stoichita | H02M 3/1563 323/271 |
| 2013/0082624 A1* | 4/2013 | Brassfield | H05B 33/0818 315/297 |
| 2015/0378377 A1 | 12/2015 | Kronmueller et al. | |
| 2017/0187200 A1* | 6/2017 | Somerville | H02J 7/0052 |
| 2017/0199537 A1* | 7/2017 | Duong | G05F 1/575 |

(Continued)

FOREIGN PATENT DOCUMENTS

| | | |
|---|---|---|
| DE | 2113630 | 10/1971 |
| DE | 10 2016 207 714 | 11/2017 |

OTHER PUBLICATIONS

German Office Action, Filing No. 10 2018 217 442.3, Applicant: Dialog Semiconductor (UK) Limited, dated May 31, 2019, 6 pages, and English language translation, 6 pages.

(Continued)

*Primary Examiner* — Alex Torres-Rivera
*Assistant Examiner* — Trinh Q Dang
(74) *Attorney, Agent, or Firm* — Saile Ackerman LLC; Stephen B. Ackerman

(57) ABSTRACT

A voltage regulator and a method are presented. The regulator has a pass device coupled to an input node at an input voltage. Furthermore, the voltage regulator has a regulator circuit to control the pass device to provide a regulated output voltage at an output node based on the input voltage. Components of the regulator circuit are arranged and operated between the input node and the output node. The voltage regulator allows a load of the voltage regulator to be arranged between the output node and a reference node at a reference voltage, wherein the reference voltage differs from the output voltage.

15 Claims, 5 Drawing Sheets

(56) References Cited

U.S. PATENT DOCUMENTS

2017/0322573 A1    11/2017  Bhattad et al.
2018/0224876 A1*   8/2018   Ogura ...................... G05F 1/59

OTHER PUBLICATIONS

STMicroelectronics N.V.: LM217, LM317 Datasheet, Rev. 20, Geneva, Switzerland, 2018—company document, 12. V to 37 V adjustable voltage regulators, pp. 1-32.
Tietze, U. et al., Semiconductor Circuitry [Halbleiter-Schaltungstechnik], 11th edition, Springer Berlin Heidelberg, New York, 1999, pp. 964-965, ISBN 3-540-64192-0 and English language translation.

* cited by examiner

600 ↘

```
┌─────────────────────────────────────────────┐ ⎸─601
│  Controlling the pass device to provide the │
│        regulated output voltage             │
└─────────────────────────────────────────────┘
```

VOLTAGE REGULATOR WITH VIRTUAL ZERO QUIESCENT CURRENT

TECHNICAL FIELD

The present document relates to voltage regulators, notably low dropout (LDO) regulators. In particular, the present document relates to increasing the power efficiency of a voltage regulator, notably at relatively low load currents.

BACKGROUND

Voltage regulators (notably LDO regulators) typically operate between at least two supply rails, such as the supply voltage VDD (e.g. a battery voltage) and a reference voltage GND (e.g. ground). As a result of this, the voltage regulator behaves as a circuit consuming quiescent current (in addition to the load current which is provided to a load of the voltage regulator). Hence, the use of a voltage regulator for providing a regulated voltage (e.g. based on the voltage of a battery) leads to an increased power consumption.

SUMMARY

The present document addresses the technical problem of reducing the power and/or quiescent current consumption of a voltage regulator. According to an aspect, a voltage regulator comprising a pass device coupled to an input node at an input voltage is described. The voltage regulator comprises a regulator circuit which is configured to control the pass device to provide a regulated output voltage at an output node based on the input voltage. Components of the regulator circuit are arranged and operated between the input node and the output node. As a result of this, the quiescent current through the components of the regulator circuit is provided to the output node. The voltage regulator is configured to allow a load of the voltage regulator to be arranged between the output node and a reference node at a reference voltage, wherein the reference voltage differs from the output voltage. As a result of this, the quiescent current through the components of the regulator circuit may be provided as load current to a load of the voltage regulator.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein

FIG. 6 shows a flow chart of an example method for operating a voltage regulator.

DESCRIPTION

Figure 1:
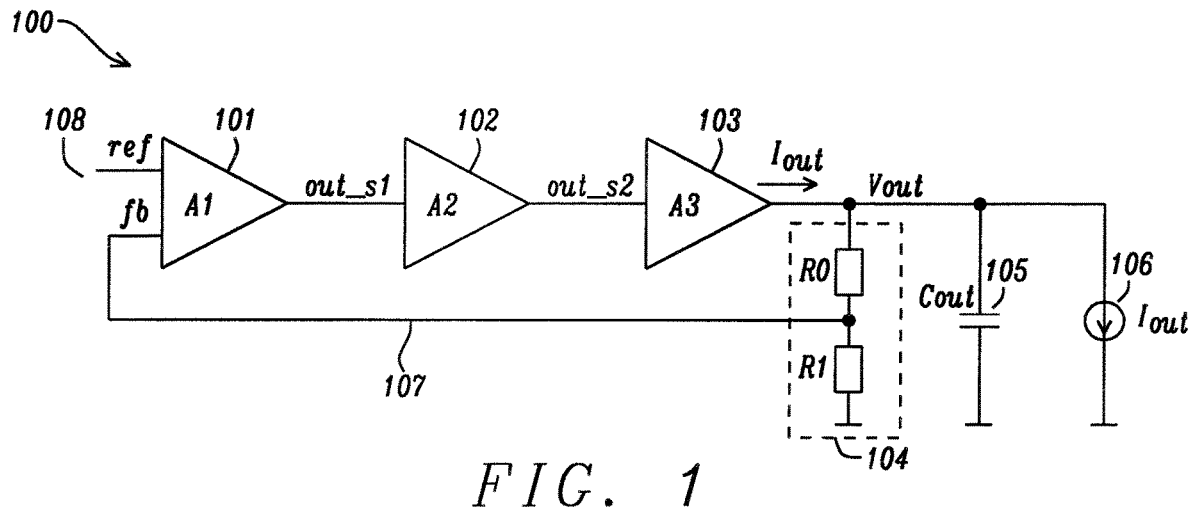
FIG. 1 illustrates an example block diagram of an LDO regulator as an example for a voltage regulator.

As indicated above, the present document is directed at the technical problem of increasing the power efficiency of a voltage regulator. In this context, FIG. 1 illustrates an LDO regulator 100 as an example for a voltage regulator. The LDO regulator 100 comprises an output amplification stage or output stage 103, comprising e.g. a field-effect transistor (FET) as a pass device, at the output and a differential or first amplification stage 101 (also referred to as error amplifier) at the input. A first input (fb) 107 of the differential or input amplification stage 101 receives a fraction of the output voltage VOUT determined by the voltage divider 104 comprising resistors R0 and R1. The second input (ref) to the differential amplification stage 101 is a voltage reference Vref 108. If the output voltage VOUT changes relative to the reference voltage Vref, the drive voltage to the output amplification stage, e.g. to the pass device, changes by a feedback mechanism called the main feedback loop to maintain a constant output voltage VOUT.

The LDO regulator 100 of FIG. 1 further comprises an additional intermediate amplification stage 102 configured to amplify the differential or error output voltage of the differential amplification stage 101. An intermediate amplification stage 102 may be used to provide an additional gain within the amplification path. Furthermore, the intermediate amplification stage 102 may provide a phase inversion.

The LDO regulator 100 is typically used in conjunction with a load capacitor Cout (also referred to as output capacitor or stabilization capacitor) 105 parallel to the load 106. The load capacitor 105 is used to stabilize the output voltage VOUT subject to a change of the load 106, in particular subject to a change of the requested load current or output current Iload/IOUT.

Figures 2A, 2B:
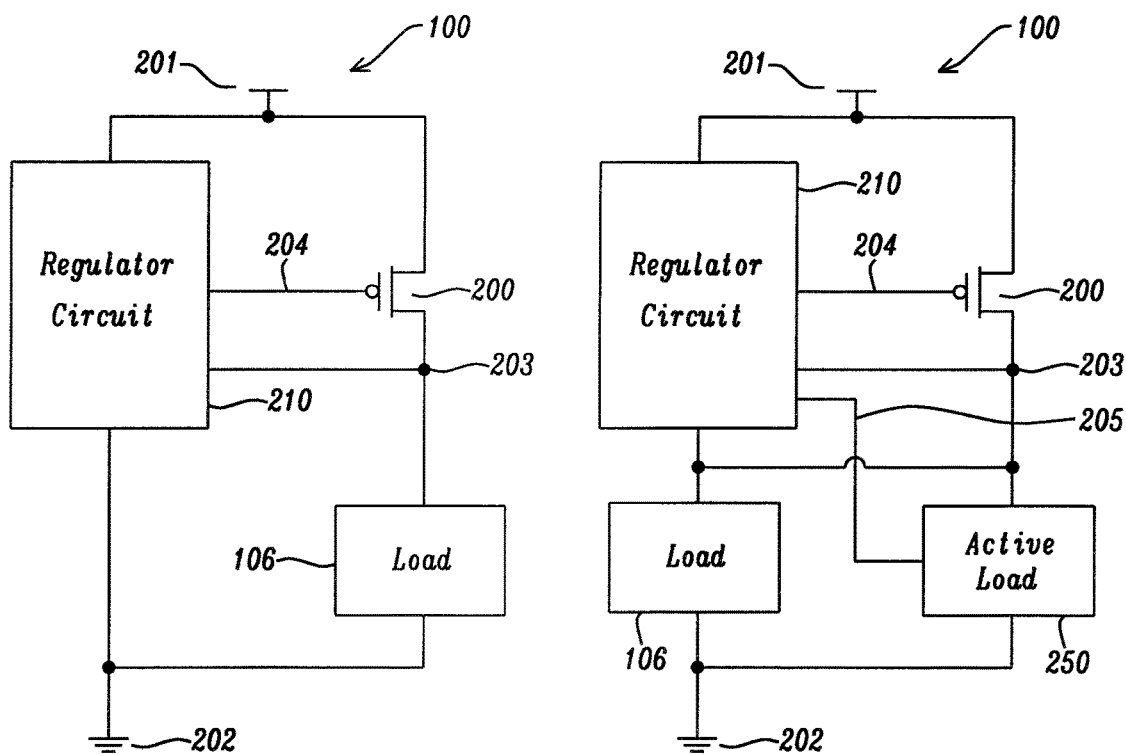
FIGS. 2A and 2B show a block diagrams of a voltage regulator with an active load.

The voltage regulator 100 of FIG. 1 may be represented as a block diagram shown in FIG. 2A. The regulator circuit 210 of the voltage regulator 100 may comprise a differential amplification stage 101, an intermediate amplification stage 102 and the drive circuitry of the output stage 103. The drive circuitry provides a control voltage 204 for the pass transistor or pass device 200, in order to provide a regulated output voltage 203 based on the input voltage 201. A load 106 of the voltage regulator 100 (e.g. a microprocessor) is coupled between the regulated output voltage 203 and a reference voltage 202 (e.g. ground). The components of the regulator circuit 210 are operated between the input voltage 201 and the reference voltage 202.

In view of the fact that the regulator circuit 210 is operated between the input voltage 201 and the reference voltage 202, the quiescent current through the regulator circuit 210 adds to the load current through the pass transistor 200 and through the load 106, such that the overall current consumption corresponds to the sum of the quiescent current and the load current.

FIG. 2B shows a voltage regulator 100 with a regulator circuit 210 that is operated between the input voltage 201 and the regulated output voltage 203. As a result of this, the quiescent current of the regulator circuit 210 flows through the load 106 such that the overall current consumption corresponds to the quiescent current (in case the load current is smaller than the quiescent current) or to the load current (in case the load current is higher than the quiescent current). Hence, the current and/or power consumption of the voltage regulator 100 may be reduced.

Furthermore, the voltage regulator 100 on the right hand side of FIG. 2a comprises an active load 250. The active load 250 may be configured to take up the quiescent current of the regulator circuit 210 in cases where there is no (sufficient) load 106 coupled to the voltage regulator 100 and/or in case the load current is smaller than the quiescent current. In particular, the active load 250 may be configured to take up the fraction of the quiescent current which is not used by the load 106. The active load 250 (also referred to herein as the auxiliary load 250) may be controlled using an auxiliary control voltage 205 (e.g. the voltage out_s2 shown in FIG. 1) provided by the regulator circuit 210. The auxiliary control voltage 205 may be indicative of the load current that is to be provided by the voltage regulator 100.

Figure 2C:
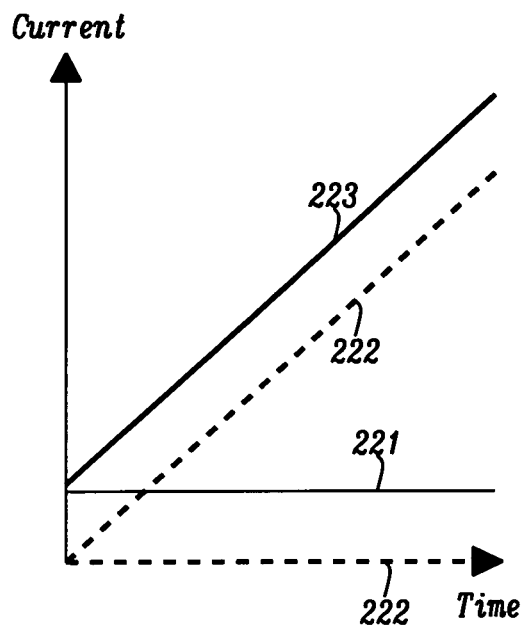
FIGS. 2C and 2D illustrate the current consumption of a voltage regulator comprising an active load.
Figure 2D:
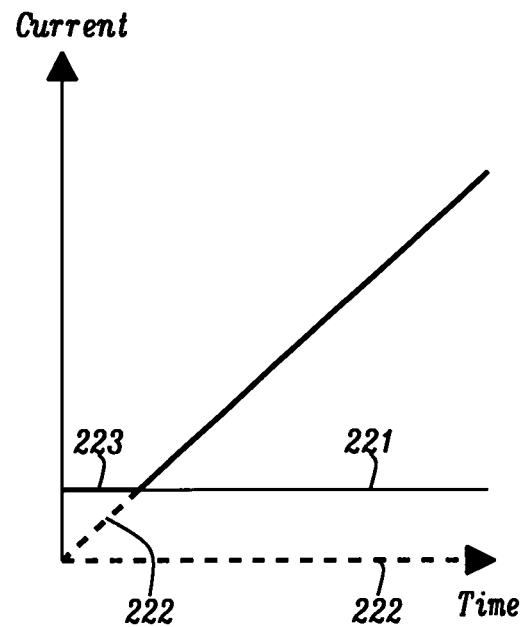

FIG. 2C illustrates how the quiescent current 221 and the load current 222 add up to an overall (output) current 223 of the voltage regulator 100, if the regulator circuit 210 is operated between the input voltage 201 and ground 202. Furthermore, FIG. 2D shows how the quiescent current 221 is part of the load current 222, thereby reducing the overall current 223, if the regulator circuit 210 is operated between the input voltage 201 and the regulated output voltage 203.

Figure 3:
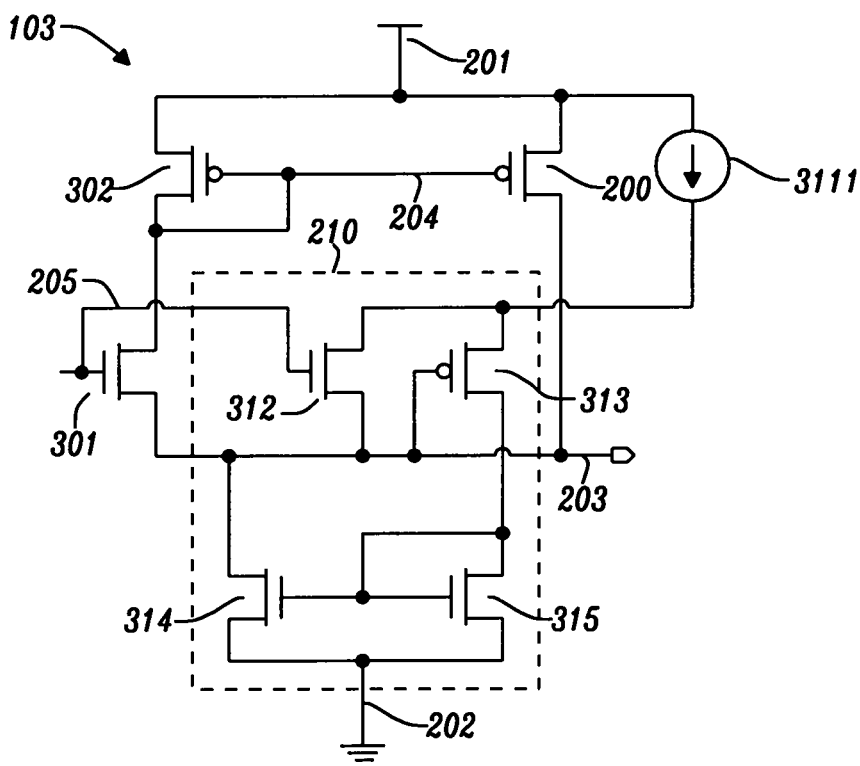
FIG. 3 shows a circuit diagram of an example active load.

FIG. 3 illustrates the output stage 103 of a voltage regulator 100 and an example of an active load 210. The output stage 103 comprises pass device control transistors 301, 302 which are configured to provide the pass control voltage 204 for controlling the pass device 200 based on an intermediate voltage (which typically corresponds to the output voltage of the intermediate amplification stage 102). As can be seen, the pass device control transistors 301, 302 are operated between the input voltage 201 and the output voltage 203. As a result of this, the quiescent current through the pass device control transistors 301, 302 also flows through the (primary) load 106 (or through the active load 250).

The intermediate voltage (which is provided by the intermediate amplification stage 102) may be used as the auxiliary control voltage 205 for controlling the active load 250. By doing this, the level of the auxiliary load current through the active load 250 may be controlled in sync with the pass transistor 200 (and by consequence in sync with the output current through the pass transistor 200). The active load 250 may be configured to increase the auxiliary load current, if the output current through the pass transistor 200 decreases (and vice versa). In particular, the active load 250 may be designed such that the auxiliary load current corresponds to the quiescent current 221, if the load current 222 through the load 106 is zero, and such that the auxiliary load current is zero, if the load current 222 through the load 106 is equal to or greater than the quiescent current 221. In between those two extremes, the auxiliary load current may be such that the sum of the auxiliary load current and the load current 222 is equal to the quiescent current 221.

The active load 250 may comprise a control transistor 312, which is controlled using the auxiliary control voltage 205, in order to set the fraction of the current provided by the current source 311, which flows through the auxiliary load designed using the transistors 313, 314, 315. The nominal current of the current source 311 may be used to set the operating point of the active load 250.

The current source 311 may be configured to provide an auxiliary current 3111. In case the control transistor 312 is fully closed (due to a relatively high load current 222), the auxiliary current may be provided through the control transistor 312 to the output node, and thereby contribute to the load current 222.

On the other hand, in case the control transistor 312 is fully open, the transistor 313 (referred to herein as the transit transistor) may be fully closed, thereby providing the auxiliary current to a first branch 315 of the current mirror 315, 314, which is configured to mirror and to amplify the auxiliary current to the output node. In particular, the current mirror 315, 314 may ensure that a current equal to the auxiliary current times the gain of the current mirror 315, 314 flows from the output node through the second branch 314 of the current mirror 315, 314 to the reference node (e.g. ground). The auxiliary current times the gain of the current mirror 315, 314 may be equal to the quiescent current 221 of the regulator circuit 210.

Hence, by operating the control transistor 312 in a linear mode, the active load 250 may be changed between an auxiliary load current of zero and an auxiliary load current which is equal to the quiescent current 221.

Figure 4:
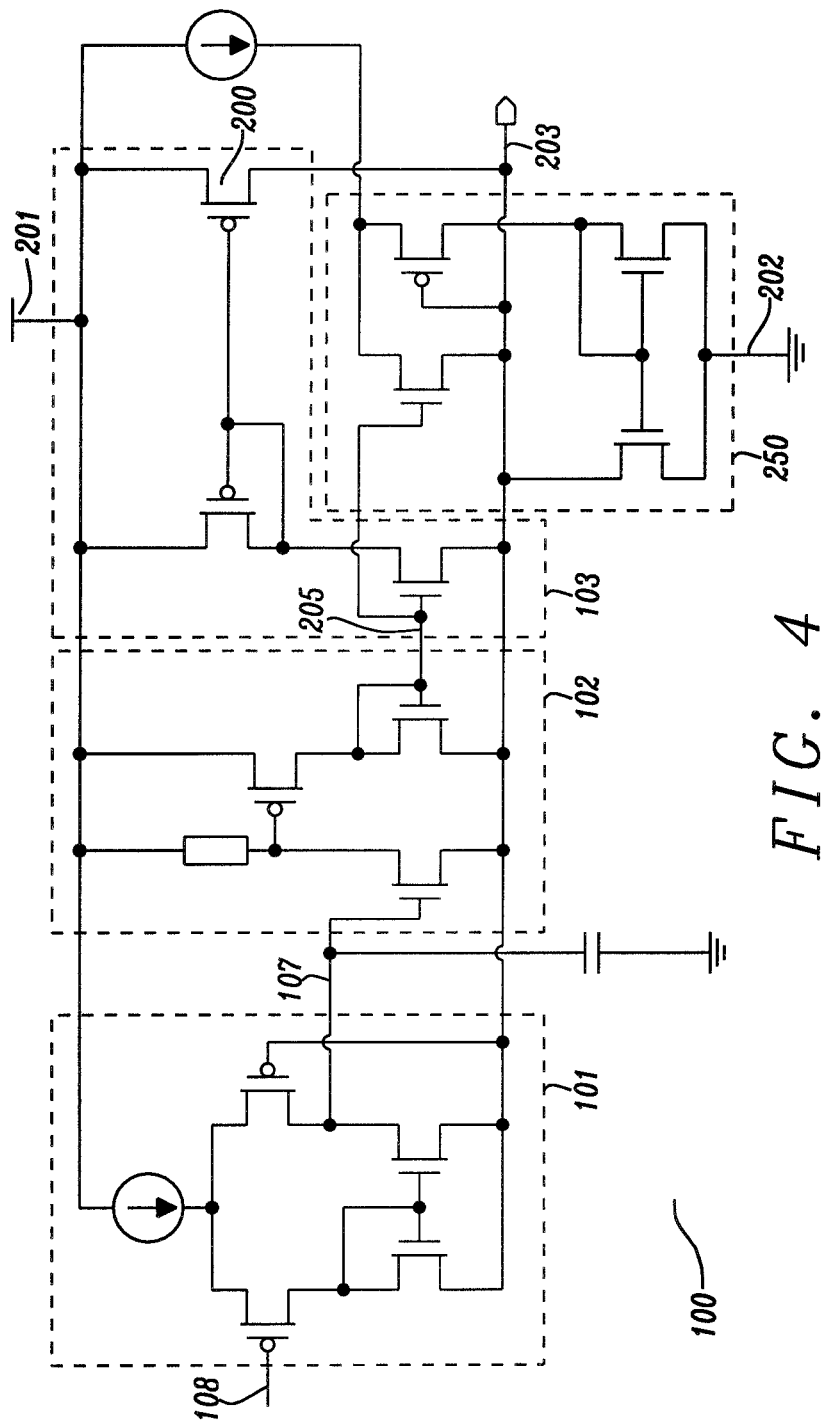
FIG. 4 shows a circuit diagram of a voltage regulator comprising an active load.

FIG. 4 shows a circuit diagram of an example voltage regulator 100 comprising a regulator circuit 210 that is operated between the input voltage 201 and the regulated output voltage 203 and that comprises an active load 250 which may be used to at least partially sink the quiescent current 221 of the regulator circuit 210, if the load current 222 is smaller than the quiescent current 221.

Hence, a voltage regulator 100 is described, which is configured to at least partially reuse the quiescent current 221 of the regulator circuit 210 for the load 106 of the voltage regulator 100. By doing this, the power efficiency of the voltage regulator 100 is increased. Furthermore, this allows increasing the quiescent current 221 of the regulator circuit 210, because the quiescent current 221 is reused as load current 222. As a result of this, the performance and the robustness of the voltage regulator 100 may be increased.

The described voltage regulator 100 may also be operated in conjunction with negative loads 106 (if the output voltage 203 is higher than the input voltage 201). Furthermore, the voltage regulator 100 may be operated without the use of a Miller capacitance, thereby reducing the bill of material of the voltage regulator 100.

Figure 5:
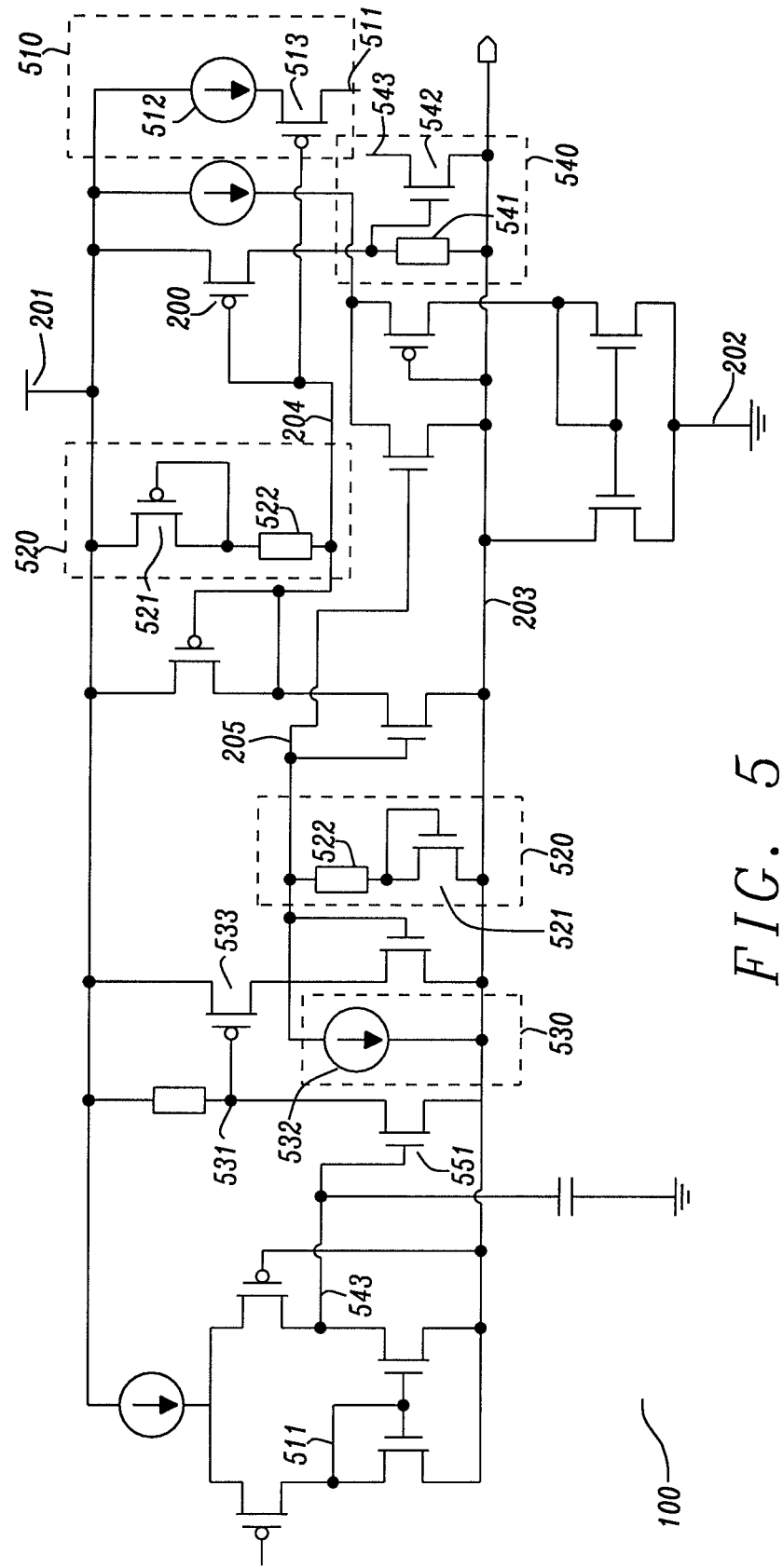
FIG. 5 shows a circuit diagram of a voltage regulator comprising circuitry for increasing the stability of a voltage regulator.

FIG. 5 shows a circuit diagram of the voltage regulator 100 of FIG. 4 comprising additional circuitry 510, 520, 530, 540. In particular, the voltage regulator 100 may comprise gain limiting circuitry 510 which is configured to limit the gain of the differential amplifier 101, in order to limit the bandwidth of the differential amplifier 101 (notably for relatively small loads 106). The gain limiting circuitry 510 may comprise a transistor 513 which is controlled using the control voltage 204, in order to control the fraction of the current of the current source 512, which is provided at the feedback point 511 within the differential pair of the differential amplifier 101. By doing this, the stability of the voltage regulator 100 may be increased at relatively low load currents 222 (e.g. a few μA).

Furthermore, the voltage regulator 100 may comprise gain limiting circuitry 520 which is configured to limit the gain of the intermediate amplification stage 102 and/or of the output stage 103. The gain limiting circuitry 520 may comprise a serial arrangement of a diode 521 and a resistor 522. A serial arrangement may be arranged between the auxiliary control voltage 205 and the output voltage 203. Alternatively or in addition, a serial arrangement may be arranged between the input voltage 201 and the control voltage 204. By doing this, the gain of the intermediate amplification stage 102 may be reduced e.g. by a factor 100 or more. As a result of this, the stability of the voltage regulator 100 may be increased.

Furthermore, the voltage regulator 100 may comprise circuitry 530 for improving the transient response of the voltage regulator 100. During some operational scenarios, the voltage at node 531 may be close to the input voltage 201, which may negatively affect the transient response of the voltage regulator 100. The circuitry 530 comprises a current source 532 which forces a defined current through transistor 533 which is controlled by the node 531, thereby shifting the operation point and/or the voltage level of node 531 and thereby improving the transient response (notably for relatively low load scenarios).

Furthermore, the voltage regulator 100 may comprise current limiting circuitry 540 which comprises a sensing resistor 541 which is configured to sense the output current through the pass transistor 200, to provide a sense voltage which is proportional to the output current. The sense voltage may be used to control a feedback transistor 542 configured to limit the voltage level of the output 543 of the differential amplifier 101. By way of example, the output current of the voltage regulator 100 may be limited to pre-determined maximum value.

It should be noted that the transistor 551 acts as a feedback device for the intermediate amplification stage 102 (i.e. feeding back the voltage 205 at the output of the intermediate amplification stage 102 to an input of the intermediate amplification stage 102).

The voltage regulator 100 may be designed in a way, where in some predefined conditions part of the regulator circuitry 210 is dynamically coupled to the reference voltage 202 (instead of the output voltage 203). Such dynamic recoupling of parts of the regulator circuitry 210 may be used to operate the voltage regulator 100 at very low dropout voltages across the pass transistor 200.

The pass device 200 and/or the output stage 103 may be of various different types (e.g. NMOS, PMOS, BJT, etc.). Furthermore, it should be noted that the regulator 100 described in the present document is only an example. The principles outlined in the present document are applicable to various different regulator architectures.

Hence, a voltage regulator 100 (notably a low-drop out, LDO, regulator) is described. The voltage regulator 100 comprises a pass device 200 (notably a pass transistor, e.g. a PMOS transistor) which is (directly) coupled to an input node at an input voltage 201. In particular, a source or drain of the pass device 200 may be (directly) coupled to the input node. On the other hand, the drain or source (i.e. the respective other port) of the pass device 200 may be coupled to the output node of the voltage regulator 100, wherein the output node is at a (regulated) output voltage 203. The voltage regulator 100 may be configured to provide a load current at the output node at the regulated output voltage 203 based on the (non-regulated) input voltage 201 at the input node.

Furthermore, the voltage regulator 100 comprises a regulator circuit 210 which is configured to control the pass device 200 to provide the regulated output voltage 203 at the output node based on the input voltage 201. For this purpose, the regulator circuit 210 may comprise one or more amplification stages 101, 102, 103. In particular, the regulator circuit 210 may comprise a differential stage 101 which is configured to generate a voltage at an output 543 of the differential stage 101 based on a feedback voltage 107 derived from the output voltage 203 and based on a reference voltage 108. The feedback voltage 107 may be equal to the output voltage 203. Furthermore, the regulator circuit 210 may comprise an intermediate amplification stage 102 which is configured to provide an auxiliary control voltage 205 at an output of the intermediate amplification stage 102 based on the voltage at the output 543 of the differential stage 101. The control voltage 204 for controlling the pass device 200 may depend on the auxiliary control voltage 205 (e.g. via a driver stage for the pass device 200).

Components of the regulator circuit 210 may be arranged and operated between the input node and the output node. In particular, the one or more amplification stages 101, 102, 103 of the regulator circuit 210 (notably the differential stage 101 and/or the intermediate amplification stage 102) may be arranged and operated between the input node and the output node. This means that a quiescent current 221 through the components of the regulator circuit 210 may flow from the input node to the output node.

The voltage regulator 100 may be configured to allow a load 106 of the voltage regulator 100 to be arranged between the output node and a reference node at a reference voltage 202 (e.g. ground), wherein the reference voltage 202 differs from the output voltage 203. Typically, the difference between the input voltage 201 and the reference voltage 202 is greater than the difference between the input voltage 201 and the output voltage 203.

In particular, the components of the regulator circuit 210 may be arranged and operated between the input node and the output node such that the quiescent current 221 through the components flows through the load 106, in case the load 106 is arranged between the output node and the reference node.

Hence, as a result of arranging the components of the regulator circuit 210 between the input node and the output node, the quiescent current 221 through the components of the regulator circuit 210 is provided to the output node and to the load 106 which is coupled to the output node of the voltage regulator 100. In other words, as a result of arranging the components of the regulator circuit 210 between the input node and the output node, the quiescent current 221 contributes to the load current 222 which is provided to a load 106 of the voltage regulator 100, thereby increasing the power efficiency of the voltage regulator 100, notably at relatively low load currents 222.

The voltage regulator 100 may comprise an auxiliary load 250 which is arranged (directly) between the output node and the reference node. The auxiliary load 250 may be configured to sink the quiescent current 221 through the components of the regulator circuit 210, notably in case the load current 222 through the load 106 is smaller than the quiescent current 221. The voltage regulator 100 may be configured to operate the auxiliary load 250 such that at most or exactly a delta current being the difference being the quiescent current 221 through the components of the regulator circuit 210 and the load current 222 through the load 106 is sunk by the auxiliary load 250. Hence, an auxiliary load 250 may be provided which is configured to sink the fraction of the quiescent current 221 that is not used by the (primary) load 106, thereby enabling a reliable and stable operation of the voltage regulator 100.

The regulator circuit 210 may be configured to generate an auxiliary control voltage 205 (e.g. being the output voltage of the intermediate amplification stage 102). As indicated above, the regulator circuit 210 may be configured to generate the control voltage 204 for controlling the pass device 200 based on the auxiliary control voltage 205.

Furthermore, the auxiliary load 250 may be controlled using the auxiliary control voltage 205. The auxiliary control voltage 205 may be indicative of the load current 222 that is to be provided to the (primary) load 106 of the voltage regulator 100. The auxiliary load 250 may be increased (in order to take up an increased fraction of the quiescent current 221 at the output node), if the auxiliary control voltage 205 indicates a relatively low load current 222. On the other hand, the auxiliary load 250 may be decreased (in order to take up a reduced fraction of the quiescent current 221 at the output node), if the auxiliary control voltage 205 indicates a relatively high load current 222. As a result of this, the voltage regulator 100 may be operated in a stable and power efficient manner.

The auxiliary load 250 may comprise a control transistor 312 which is controlled based on the auxiliary control voltage 205 and which is configured to set the current that is sunk from the output node to the reference node in dependence of the auxiliary control voltage 205. The control transistor 312 may be or may comprise a NMOS (n-type metaloxide semiconductor) transistor. The gate of the control transistor 312 may be (directly) coupled to the auxiliary control voltage 205. By making use of a control transistor 312, the auxiliary load 250 (and the auxiliary load current) may be set in a precise and efficient manner.

The auxiliary load 250 may comprise a current source 311 which is configured to draw an auxiliary current from the input node. The control transistor 312 may be configured to couple or to decouple the current source 311 to or from the output node.

Furthermore, the auxiliary load 250 may comprise a current mirror 314, 315, wherein the current mirror 314, 315 comprises a first branch 315 (with a first transistor, e.g. a NMOS transistor) and a second branch 314 (with a second transistor, e.g. a NMOS transistor).

The current mirror 314, 315 may exhibit a gain, such that a current through the second branch 314 corresponds to a current through the first branch 315 multiplied by the gain. The current mirror 314, 315 may be used to set the level of the auxiliary load current through the auxiliary load 250. For this purpose, the auxiliary current (which is provided by the current source 311) multiplied by the gain preferably corresponds or is equal to the quiescent current 221 through the components of the regulator circuit 210.

In addition, the auxiliary load 250 may comprise a transit transistor 313 which is configured to couple or to decouple the current source 311 to or from the first branch 315 of the current mirror 314, 315. The transit transistor 313 may be a PMOS (p-type MOS) transistor. The gate of the transit transistor 313 may be coupled to the output node.

In particular, the first branch 315 of the current mirror 314, 315 may be (directly) coupled between the transit transistor 313 and the reference node. On the other hand, the second branch 314 of the current mirror 314, 315 may be (directly) coupled between the output node and the reference node. Hence, the transit transistor 313 may be used to vary the auxiliary load current through the auxiliary load 250 (i.e. between the output node and the reference node) continuously between zero (if the transit transistor 313 is fully opened) and the auxiliary current multiplied by the gain (if the transit transistor 313 is fully closed).

The control transistor 312 and the transit transistor 313 may be designed and/or arranged such that the auxiliary current is provided (completely) to the output node, if the control transistor 312 is closed, and such that the auxiliary current is provided (completely) to the first branch 315 of the current mirror 314, 315, if the control transistor 312 is open.

By doing this, the auxiliary load current through the auxiliary load 250 may be set in a precise and smooth manner.

As indicated above, the regulator circuit 210 may comprise a differential stage 101 configured to generate a voltage at the output 543 of the differential stage 101 based on the feedback voltage 107 and based on a reference voltage 108. The control voltage 204 for controlling the pass device 200 may depend on the voltage at the output 543 of the differential stage 101.

The voltage regulator 100 may comprise a first gain limiting circuit 510 which is configured to limit the gain of the differential stage 101. For this purpose, the first gain limiting circuit 510 may comprise a feedback transistor 513 which is controlled based on the control voltage 204 and which is coupled to an internal node 511 of the differential stage 101. By limiting the gain of the differential stage 101, the stability of the voltage regulator 100 may be increased at relatively low loads 106 or load currents 222.

Alternatively or in addition, the voltage regulator 100 may comprise a current limiting circuit 540 which is configured to limit the output current 223 that is provided by the voltage regulator 100 at the output node. In other words, the voltage regulator 100 may comprise an overload protection. The current limiting circuit 540 may comprise sensing means 541 (e.g. a sensing resistor) which are configured to sense the output current 223. Furthermore, the current limiting circuit 540 may comprise a current limiting transistor 542 which is configured to set (notably to clamp) the level of the voltage at the output 543 of the differential stage 101 based on the sensed output current, thereby limiting the output current 223 to a predetermined maximum level. As a result of this, the reliability and stability of the voltage regulator 100 is increased.

As indicated above, the regulator circuit 210 may comprise an intermediate amplification stage 102 which is configured to provide an auxiliary control voltage 205 at an output of the intermediate amplification stage 102 based on the voltage at the output 543 of the differential stage 101. The control voltage 204 for controlling the pass device 200 typically depends on the auxiliary control voltage 205.

The voltage regulator 100 may comprise a second gain limiting circuit 520 which is configured to limit the gain of the intermediate amplification stage 102 (in order to increase the stability of the voltage regulator 100, notably at relatively low load currents 222). The second gain limiting circuit 520 may comprise a serial arrangement of a resistor 522 and a diode 521 which is arranged between the auxiliary control voltage 205 and the output node. Alternatively or in addition, the second gain limiting circuit 520 may comprise a serial arrangement of a resistor 522 and a diode 521 which is arranged between the control voltage 204 and the input node.

The intermediate amplification stage 102 may comprise a serial arrangement of an intermediate control transistor 551 and a resistor, which is arranged between the input node and the output node. The intermediate control transistor 551 may be controlled based on the voltage at the output 543 of the differential stage 101.

The voltage regulator 100 may comprise a biasing circuit 530 which is configured to bias a voltage at the midpoint 531 between the control transistor 551 and the resistor. By doing this, the transient response of the voltage regulator 100 may be increased in cases where the voltage at the midpoint 531 is close to the input voltage.

The biasing circuit 530 may comprise a current source 532 which is configured to draw a current through a transistor 533 which is controlled based on the voltage at the midpoint 531 between the control transistor 551 and the resistor. The control voltage 204 for controlling the pass device 200 may depend on the current through the transistor 533.

The voltage regulator 100 may be configured to sense that the voltage drop across the pass device 200 is at or below a voltage threshold. In reaction to this, the components of the regulator circuit 210 may at least partially be rearranged to be arranged and operated between the input node and the reference node, such that a voltage drop across the rearranged components is increased. As a result of this, a stable operation of the voltage regulator 100 may be achieved, even for relatively low drop out voltages across the pass device 200.

FIG. 6 shows a flow chart of an example method 600 for providing a regulated output voltage 203 at an output node of a voltage regulator 100 based on an input voltage 201 at an input node of the voltage regulator 100. The voltage regulator comprises a pass device 200 and a regulator circuit 210. Components of the regulator circuit 210 are arranged and operated between the input node and the output node. The voltage regulator 100 is configured to allow a load 106 of the voltage regulator 100 to be arranged between the output node and a reference node at a reference voltage 202, which differs from the output voltage 203. The method 600 comprises controlling 601 the pass device 200 to provide the regulated output voltage 203 at the output node based on the input voltage 201.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A voltage regulator comprising
a pass device coupled to an input node at an input voltage; and
a regulator circuit configured to control the pass device to provide a regulated output voltage at an output node based on the input voltage;
wherein components of the regulator circuit are arranged and operated between the input node and the output node; and wherein the voltage regulator is configured to allow a load of the voltage regulator to be arranged between the output node and a reference node at a reference voltage, wherein the reference voltage differs from the output voltage; wherein the components of the regulator circuit are arranged and operated between the input node and the output node such that a quiescent current of the components of the regulator circuit flows from the input node through the components of the regulator circuit through the load, in case the load is arranged between the output node and the reference node; wherein
the voltage regulator comprises an auxiliary load arranged between the output node and the reference node; and
the auxiliary load is configured to sink, in case a load current through the load is smaller than the quiescent current, a current from the input node through the components of the regulator circuit through the auxiliary load to the reference node.

2. The voltage regulator according to claim 1, wherein
the regulator circuit is configured to generate an auxiliary control voltage;
the regulator circuit is configured to generate a control voltage for controlling the pass device based on the auxiliary control voltage; and
the auxiliary load is controlled using the auxiliary control voltage.

3. The voltage regulator according to claim 1, wherein the voltage regulator is configured to operate the auxiliary load such that at most or exactly a delta current being the difference being the quiescent current through the components of the regulator circuit and the load current through the load is sunk by the auxiliary load.

4. The voltage regulator according to claim 1, wherein
the regulator circuit comprises a differential stage configured to generate a voltage at an output of the differential stage based on a feedback voltage derived from the output voltage and based on a reference voltage; and
a control voltage for controlling the pass device depends on the voltage at the output of the differential stage.

5. The voltage regulator according to claim 2, wherein the auxiliary load comprises a control transistor which is controlled based on the auxiliary control voltage and which is configured to set a current that is sunk from the output node to the reference node in dependence of the auxiliary control voltage.

6. The voltage regulator according to claim 4, wherein
the voltage regulator comprises a first gain limiting circuit configured to limit a gain of the differential stage; and
the first gain limiting circuit notably comprises a feedback transistor which is controlled based on the control voltage and which is coupled to an internal node of the differential stage.

7. The voltage regulator according to claim 4, wherein
the voltage regulator comprises a current limiting circuit configured to limit an output current provided by the voltage regulator at the output node; and
the current limiting circuit notably comprises
sensing means configured to sense the output current; and
a current limiting transistor configured to set a level of the voltage at the output of the differential stage based on the sensed output current.

8. The voltage regulator according to claim 4, wherein
the regulator circuit comprises an intermediate amplification stage configured to provide an auxiliary control voltage at an output of the intermediate amplification stage based on the voltage at the output of the differential stage; and
the control voltage for controlling the pass device depends on the auxiliary control voltage.

9. The voltage regulator according to claim 4, wherein the voltage regulator is configured to
sense that a voltage drop across the pass device is at or below a voltage threshold; and
in reaction to this, rearrange the components of the regulator circuit at least partially between the input node and the reference node, such that a voltage drop across the rearranged components is increased.

10. The voltage regulator according to claim 5, wherein
the auxiliary load comprises a current mirror;
the auxiliary load comprises a current source configured to draw an auxiliary current from the input node;

the control transistor is configured to couple or to decouple the current source to or from the output node;

the auxiliary load comprises a transit transistor which is configured to couple or to decouple the current source to or from a first branch of the current mirror;

a second branch of the current mirror is coupled to the output node;

the first and second branch are coupled to the reference node; and the control transistor and the transit transistor are such that the auxiliary current is provided to the output node, if the control transistor is closed, and such that the auxiliary current is provided to the first branch of the current mirror, if the control transistor is open.

11. The voltage regulator according to claim 8, wherein the voltage regulator comprises a second gain limiting circuit configured to limit a gain of the intermediate amplification stage; and the second gain limiting circuit notably comprises
 a serial arrangement of a resistor and a diode which is arranged between the auxiliary control voltage and the output node; and/or
 a serial arrangement of a resistor and a diode which is arranged between the control voltage and the input node.

12. The voltage regulator according to claim 8, wherein the intermediate amplification stage comprises a serial arrangement of a control transistor and a resistor, which is arranged between the input node and the output node;

the control transistor is controlled based on the voltage at the output of the differential stage;

the voltage regulator comprises a biasing circuit configured to bias a voltage at a midpoint between the control transistor and the resistor; and the biasing circuit notably comprises a current source configured to draw a current through a transistor which is controlled based on the voltage at the midpoint between the control transistor and the resistor.

13. The voltage regulator according to claim 10, wherein the current mirror exhibits a gain, such that a current through the second branch corresponds to a current through the first branch multiplied by the gain; and the auxiliary current multiplied by the gain corresponds to a quiescent current through the components of the regulator circuit.

14. The voltage regulator according to claim 10, wherein a gate of the transit transistor is coupled to the output node;

the transit transistor is a PMOS transistor; and/or the control transistor is a NMOS transistor.

15. A method for providing a regulated output voltage at an output node of a voltage regulator based on an input voltage at an input node of the voltage regulator; wherein the voltage regulator comprises a pass device coupled to the input node and a regulator circuit to control the pass device to provide the regulated output voltage; wherein components of the regulator circuit are arranged and operated between the input node and the output node; and wherein the voltage regulator is to allow a load of the voltage regulator to be arranged between the output node and a reference node at a reference voltage, which differs from the output voltage; wherein the components of the regulator circuit are arranged and operated between the input node and the output node such that a quiescent current of the components of the regulator circuit flows from the input node through the components of the regulator circuit through the load, in case the load is arranged between the output node and the reference node; wherein the voltage regulator comprises an auxiliary load arranged between the output node and the reference node; wherein the method comprises controlling the pass device to provide the regulated output voltage at the output node based on the input voltage, and sinking, by the auxiliary load, in case a load current through the load is smaller than the quiescent current, a current from the input node through the components of the regulator circuit through the auxiliary load to the reference node.

* * * * *